United States Patent [19]
Gerhardt

[11] Patent Number: 5,281,511
[45] Date of Patent: Jan. 25, 1994

[54] PROCESS FOR PRODUCING AN EMBOSSING DIE IN ROLL FORM

[75] Inventor: Joergen Gerhardt, Dragoer, Denmark

[73] Assignee: Gerhardt International A/S, Kastrup, Denmark

[21] Appl. No.: 924,649

[22] Filed: Aug. 4, 1992

[30] Foreign Application Priority Data

Aug. 5, 1991 [DE] Fed. Rep. of Germany ....... 4125931

[51] Int. Cl.[5] .............................................. G03F 7/00
[52] U.S. Cl. .................................. 430/320; 430/323; 430/329; 101/28
[58] Field of Search ............... 430/320, 323, 329, 307; 101/28, 32; 156/659.1, 639

[56] References Cited

U.S. PATENT DOCUMENTS

| | | |
|---|---|---|
| 2,383,080 | 8/1945 | Reilly et al. ........................ 101/401.2 |
| 2,816,025 | 12/1957 | Dahlberg ............................ 430/323 |
| 3,327,369 | 6/1967 | Catlin ..................................... 101/28 |
| 3,573,119 | 3/1971 | Fishaber et al. ..................... 156/641 |
| 3,752,227 | 8/1973 | Bulson .................................... 165/89 |
| 4,116,594 | 9/1978 | Leanna et al. ........................... 425/3 |
| 4,601,868 | 7/1986 | Radel et al. ........................... 264/504 |
| 4,897,163 | 1/1990 | Verheesen .............................. 205/75 |

FOREIGN PATENT DOCUMENTS

| | | |
|---|---|---|
| 610839 | 12/1960 | Canada ................................. 430/323 |
| 1182194 | 11/1964 | Fed. Rep. of Germany . |
| 2009491 | 9/1970 | Fed. Rep. of Germany . |
| 54-155946 | 12/1979 | Japan . |
| 2-099207 | 4/1990 | Japan . |
| 4471 | of 1883 | United Kingdom ................ 430/323 |

Primary Examiner—Charles L. Bowers, Jr.
Assistant Examiner—John A. McPherson
Attorney, Agent, or Firm—Foley & Lardner

[57] ABSTRACT

A process for producing an embossing die in roll form for embossing a relief on at least one side of a flat material. The process includes the steps of applying a photoresist layer to one side of a metal sheet in planar form; exposing the photoresist layer through a film having a pattern corresponding to the relief; developing the metal sheet by removing unexposed parts of the photoresist layer; bending the metal sheet into sleeve form around a roll such that exposed parts of the photoresist layer face outwardly; etching unexposed regions of the metal sheet down to a predetermined depth; removing the exposed parts of the photoresist layer from the metal sheet; connecting mutually facing edges of the metal sheet; and fastening the metal sheet to a die roll.

15 Claims, 3 Drawing Sheets

PROCESS FOR PRODUCING AN EMBOSSING DIE IN ROLL FORM

BACKGROUND OF THE INVENTION

The invention relates to a process for producing an embossing die in roll form for embossing a positive and/or negative relief on at least one side of a flat material.

SUMMARY OF THE INVENTION

An object of the present invention is to provide a process for producing an embossing die having a minimum of distortion and being a highly accurate representation of a relief to be embossed.

This object and other objects and advantages of the present invention are realized by a process for producing an embossing die in roll form for embossing a relief on at least one side of a flat material, comprising the steps of applying a photoresist layer to a side of a planar metal sheet; exposing said photoresist layer on said metal sheet in planar form through a film having a pattern corresponding to said relief; developing said metal sheet by removing unexposed parts of said photoresist layer; bending said metal sheet into a generally cylindrical sleeve form such that exposed parts of said photoresist layer face radially outwardly; etching down to a predetermined depth regions of said metal sheet in said sleeve form, said regions lying between said exposed parts; removing said exposed parts of said photoresist layer from said metal sheet; and connecting at least a portion of mutually facing edges of said metal sheet.

Further objects, features and advantages of the present invention will become apparent from the detailed description of preferred embodiments that follows, when considered together with the attached figures of drawings.

BRIEF DESCRIPTION OF THE DRAWINGS

The invention is described below by an illustrative embodiment with reference to the attached drawings. The attached drawings are hereby expressly made a part of the specification.

DETAILED DESCRIPTION OF THE PREFERRED EMBODIMENTS

Figure 1:
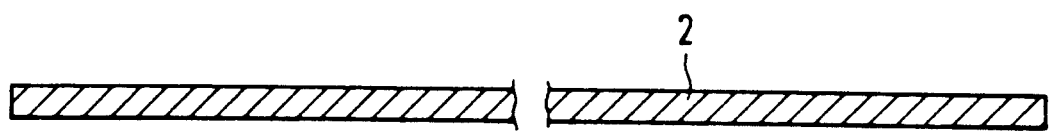
FIGS. 1 to 7 show successive process steps of an embodiment of the invention.

The inventive process comprises a procedure wherein, in an exposing step, a metal sheet in planar form—preferably of a thickness of 0.40 Mm to 1.00 Mm—is provided on one side with a photoresist layer and is exposed through a film—or an equivalent template—which is provided with a pattern corresponding to the relief, wherein then, in a developing step, the unexposed regions of the photoresist layer are removed, so that the —hardened—exposed regions of the photoresist layer remain, wherein then the metal sheet is bent in sleeve form around a roll in such a way that its exposed—hardened—regions face outwardly, wherein then the metal sheet bent in sleeve form—preferably still on the roll —is turned about its axis and the regions of the metal sheet lying between the exposed—hardened—regions of the photoresist layer are etched out down to a redetermined depth of—preferably 0.20 mm to 0.60 mm—with an etching liquid, wherein then the exposed hardened regions of the photoresist layer are removed from the metal sheet bent in sleeve form, which is laid around the roll or around another roll of equal diameter, wherein then the mutually facing edges of the metal sheet in sleeve form, with its etched side facing outwardly, are connected to each other, at least at certain points, to form a metal sheet sleeve and wherein then the metal sheet sleeve is fastened on the roll or another roll of equal diameter.

For optimum quality of this process it is important that the metal sheet is exposed in the planar state and is etched in the sleeve-shaped state. The developing step is also preferably performed on the metal sheet in the planar state.

In principle it is not necessary for the metal sheet to be adapted in size to the circumference of the roll already during exposing and possibly developing. In this case, however, the metal sheet is sized to correspond to the circumference of the roll before it is bent around the roll.

The metal sheet need not be etched on the same roll onto which it is finally applied as a sleeve. In any case, however, it is recommendable to secure the metal sheet on the respective roll during etching by etching-resistant, removable adhesive strips.

In order to make a durable sleeve from the metal sheet, the mutually facing edges of the metal sheet are preferably connected to each other by spot welding to form the sleeve. In any case, the metal sheet sleeve is preferably given an inside diameter which is somewhat smaller than the diameter of the roll, in order that it can be thermally shrunk onto the roll by first heating the sleeve, then, fitting it onto the roll and subsequently cooling the sleeve to achieve the shrink fit. The dimensional tolerances may in this case be so small that, before the shrinking step, the roll must be pressed into the metal sheet sleeve.

Therefore, one possibility for applying the metal sheet sleeve to the roll is that the metal sheet sleeve is shrunk onto the roll by thermal reduction of its diameter.

Another possibility is that the metal sheet sleeve is shrunk onto the roll by thermal enlargement of the diameter of the roll preferably using a heating element in an inner space of the roll. Such a metal sheet sleeve then need only be seated firmly on the roll when the heating element is effective, that is, for example, only during use of the embossing die, but otherwise not, so that the metal sheet sleeve can be easily exchanged.

Steel and brass have proved to be particularly successful as material for the roll.

Figure 2:
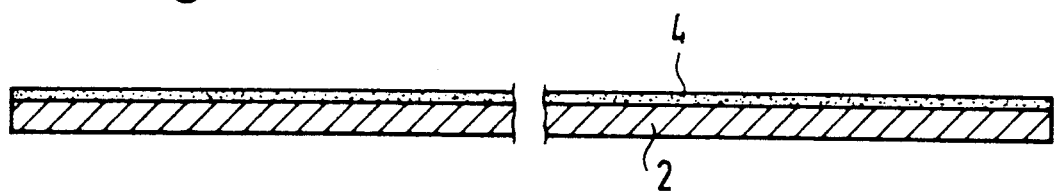
Figure 3:
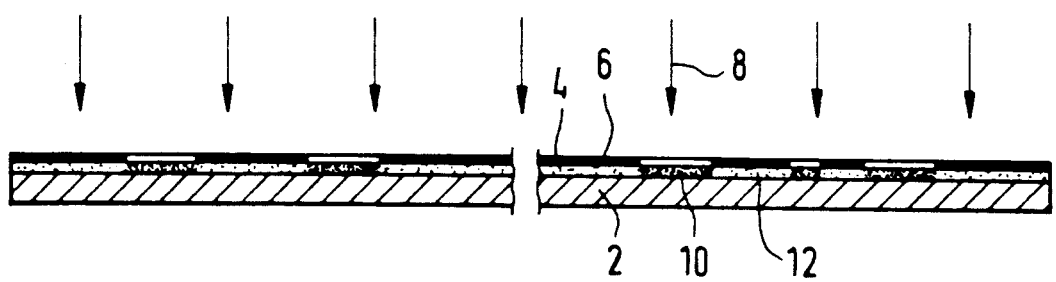
Figure 4:
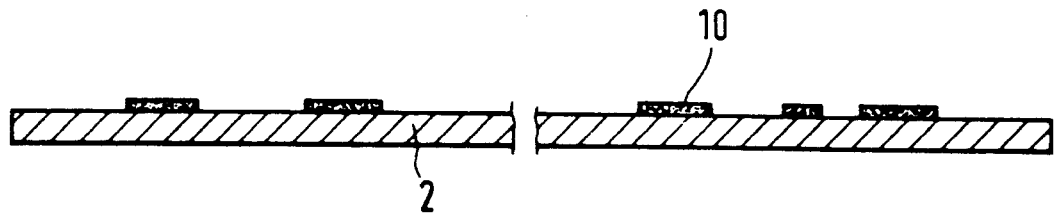

According to FIG. 1, a planar metal sheet 2 is provided. According to FIG. 2, this metal sheet 2 is provided with a layer 4 of a photoresist. According to FIG. 3, a film 6 is laid onto the photoresist layer 4, through which film the photoresist layer 4 is exposed (arrows 8). The regions 10 of the photoresist layer 4 onto which the light falls are hardened by the exposure. Subsequently, the film 6 is removed and the unexposed regions 12 of the photoresist layer 4 are washed away. According to FIG. 4, there remains the metal sheet 2 with the exposed hardened regions 10 of the former photoresist layer 4.

Figure 5:
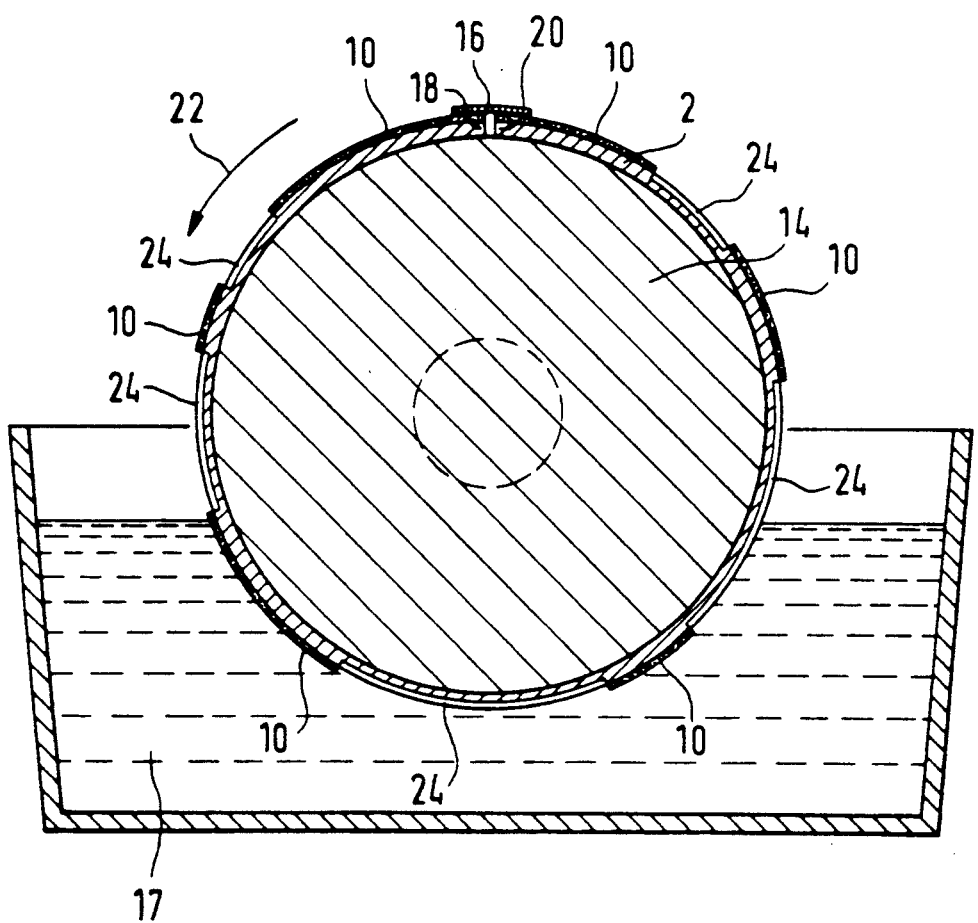
Figure 6:
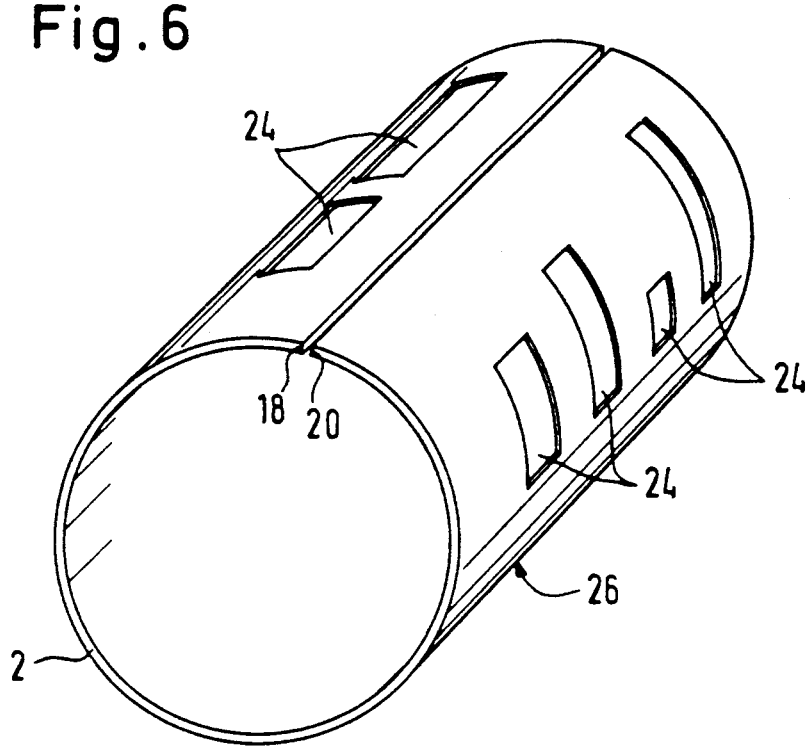
Figure 7:
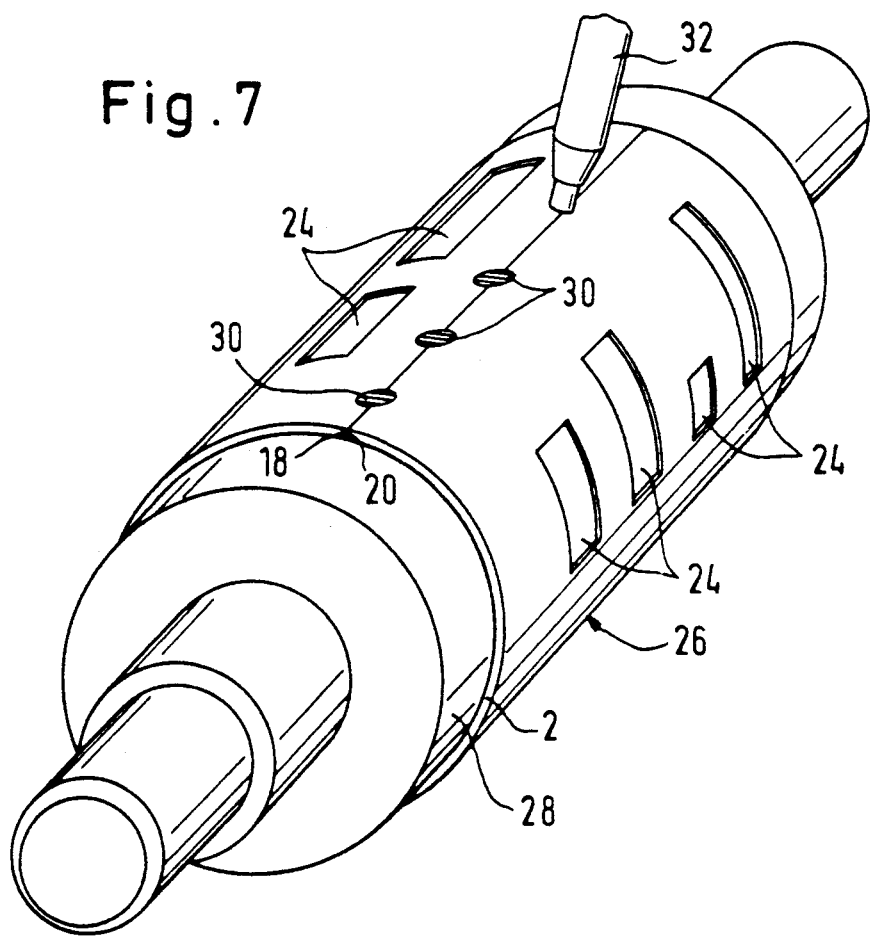

According to FIG. 5, this metal sheet 2 is then laid around a roll 14 (possibly after sizing to correspond to the circumference of the roll) and secured there by adhesive strips 16, which cover over the mutually facing edges 18, 20 of the metal sheet 2.

The roll 14 with the metal sheet 2 on it is then immersed in an etching bath 17 and rotated in the direction of the arrow 22 about its axis. In the etching bath, those regions 24 of the metal sheet 2 which lie between the hardened etching-resistant regions 10 of the former photoresist layer 4 are etched out.

Subsequently, the adhesive strips 16 are removed, and so too are the etching-resistant regions 10. Then, the axially slit sleeve 26 which has been created from the metal sheet 2 can be taken off the roll 14 and fitted onto a die roll 28, where its mutually facing edges 18, 20 are connected to each other by welding spots 30 by means of a welding tool 32.

Although the present invention has been described in relation to certain preferred embodiments, the inventive method encompasses many variations and alterations falling within the scope of the claims, and equivalents thereof.

What is claimed is:

1. A process for producing an embossing die in roll form for embossing a relief on at least one side of a flat material, comprising the steps of:
   applying a photoresist layer to a side of a metal sheet in planar form;
   exposing said photoresist layer on said metal sheet in planar form through a film having a pattern corresponding to said relief;
   developing said metal sheet by removing unexposed parts of said photoresist layer;
   bending said metal sheet into a generally cylindrical sleeve form such that exposed parts of said photoresist layer face radially outwardly;
   etching down to a predetermined depth regions of said metal sheet in said sleeve form, said regions lying between said exposed parts;
   removing said exposed parts of said photoresist layer from said metal sheet; and
   connecting at least a portion of mutually facing edges of said metal sheet to form a generally cylindrical die.

2. A process as claimed in claim 1, further comprising the step of fastening said die to a die roll.

3. A process as claimed in claim 1, wherein the developing step includes the step of developing said metal sheet in planar form.

4. A process as claimed in claim 1, wherein said bending step comprises bending the metal sheet around a roll having a circumference, and further comprising the step of sizing said metal sheet to correspond to the circumference of said roll before performing the bending step.

5. A process as claimed in claim 3, wherein the bending step includes the step of securing said metal sheet in sleeve form on said roll by etching-resistant, removable adhesive strips.

6. A process as claimed in claim 1, wherein the connecting step includes the step of connecting mutually facing edges of said metal sheet in sleeve form to each other by spot welding.

7. A process as claimed in claim 2, wherein the fastening step includes the step of thermally shrinking said die onto said die roll.

8. A process as claimed in claim 7, wherein the fastening step includes the steps of thermally enlarging said die, fitting said die onto said die roll, and then cooling said die so that said die is shrunk onto said die roll.

9. A process as claimed in claim 2, wherein the fastening step includes the step of pressing said die roll into said die.

10. A process as claimed in claim 2, wherein the fastening step includes the step of thermally enlarging said die roll.

11. A process as claimed in claim 10, wherein the thermal enlarging step includes the step of thermally enlarging said die roll by heating a heating element in an inner space of said die roll.

12. A process as claimed in claim 2, wherein said die roll comprises steel or brass.

13. A process as claimed in claim 1, wherein the metal sheet has a thickness of from about 0.40 mm to 1.00 mm.

14. A process as claimed in claim 1, wherein the etching step includes the step of immersing said metal sheet in said sleeve form in a bath and turning said metal sheet in said sleeve form about its axis.

15. A process as claimed in claim 11 wherein the etching step includes the step of etching said regions to a depth of from about 0.20 mm to 0.60 mm.

* * * * *